United States Patent
Chu et al.

(10) Patent No.: US 10,961,487 B2
(45) Date of Patent: Mar. 30, 2021

(54) SEMICONDUCTOR DEVICE CLEANING SOLUTION, METHOD OF USE, AND METHOD OF MANUFACTURE

(71) Applicant: Taiwan Semiconductor Manufacturing Company, Ltd., Hsinchu (TW)

(72) Inventors: Pinlei Edmund Chu, Hsinchu (TW); Chun-Wei Hsu, Hsinchu (TW); Ling-Fu Nieh, Taipei (TW); Chi-Jen Liu, Taipei (TW); Liang-Guang Chen, Hsinchu (TW); Yi-Sheng Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/152,965

(22) Filed: Oct. 5, 2018

(65) Prior Publication Data
US 2019/0161711 A1    May 30, 2019

Related U.S. Application Data

(60) Provisional application No. 62/592,891, filed on Nov. 30, 2017.

(51) Int. Cl.
*H01L 21/02* (2006.01)
*H01L 21/302* (2006.01)
*B08B 1/00* (2006.01)
*C11D 11/00* (2006.01)
*C11D 7/26* (2006.01)
*H01L 21/321* (2006.01)

(52) U.S. Cl.
CPC .......... *C11D 11/0047* (2013.01); *C11D 7/261* (2013.01); *C11D 7/268* (2013.01); *H01L 21/02074* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 5,051,134 A * | 9/1991 | Schnegg | H01L 21/02052 134/3 |
| 2004/0031107 A1* | 2/2004 | Pegelow | C11D 3/222 8/115.51 |
| 2004/0074518 A1* | 4/2004 | Korthuis | C09G 1/04 134/1.3 |
| 2008/0004197 A1* | 1/2008 | Kneer | C11D 1/54 510/245 |
| 2009/0239777 A1* | 9/2009 | Angst | C11D 3/0084 510/175 |
| 2009/0291873 A1* | 11/2009 | Tamboli | C11D 3/33 510/175 |

(Continued)

*Primary Examiner* — Shamim Ahmed
(74) *Attorney, Agent, or Firm* — Slater Matsil, LLP

(57) ABSTRACT

A semiconductor cleaning solution for cleaning a surface of a semiconductor device, and a method of use and a method of manufacture of the cleaning solution are disclosed. In an embodiment, a material is polished away from a first surface of the semiconductor device and the first surface is cleaned with the cleaning solution. The cleaning solution may include a host having at least one ring. The host may have a hydrophilic exterior and a hydrophobic interior.

20 Claims, 12 Drawing Sheets

(56) References Cited

U.S. PATENT DOCUMENTS

| | | | | |
|---|---|---|---|---|
| 2010/0163788 A1* | 7/2010 | Visintin | ............... | C11D 1/62 |
| | | | | 252/79.3 |
| 2011/0180747 A1* | 7/2011 | Lee | ............... | C23F 1/14 |
| | | | | 252/79.1 |
| 2014/0302752 A1* | 10/2014 | Tsuchiya | ............... | B24B 37/044 |
| | | | | 451/41 |
| 2016/0083676 A1* | 3/2016 | Mikhaylichenko | .. | C11D 3/3773 |
| | | | | 134/1 |
| 2016/0376532 A1* | 12/2016 | Heo | ............... | C11D 3/32 |
| | | | | 510/175 |
| 2017/0211023 A1* | 7/2017 | Zhang | ............... | B01J 35/0013 |
| 2018/0166273 A1* | 6/2018 | Huang | ............... | H01L 21/02074 |

* cited by examiner

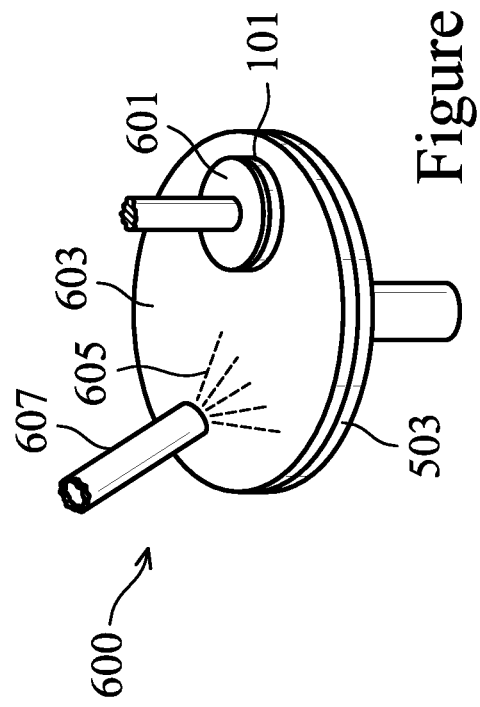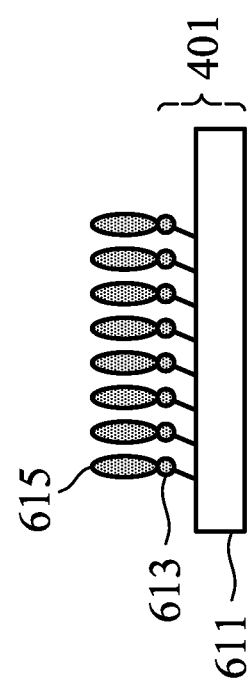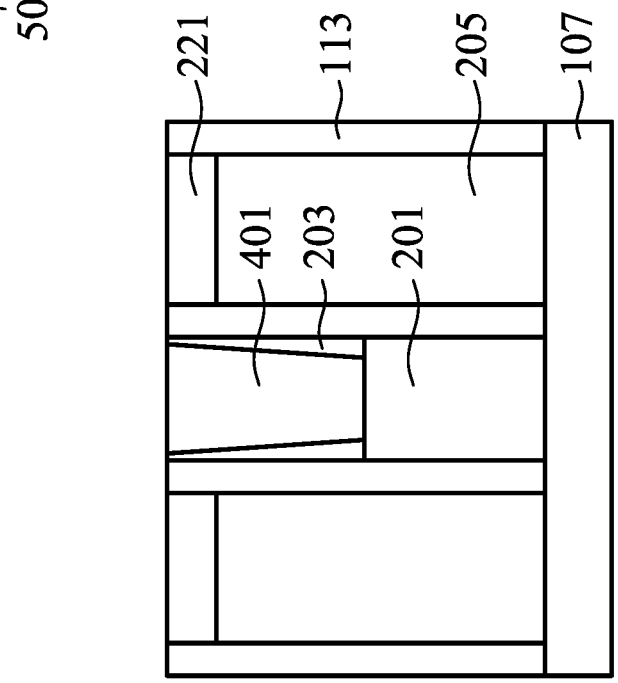

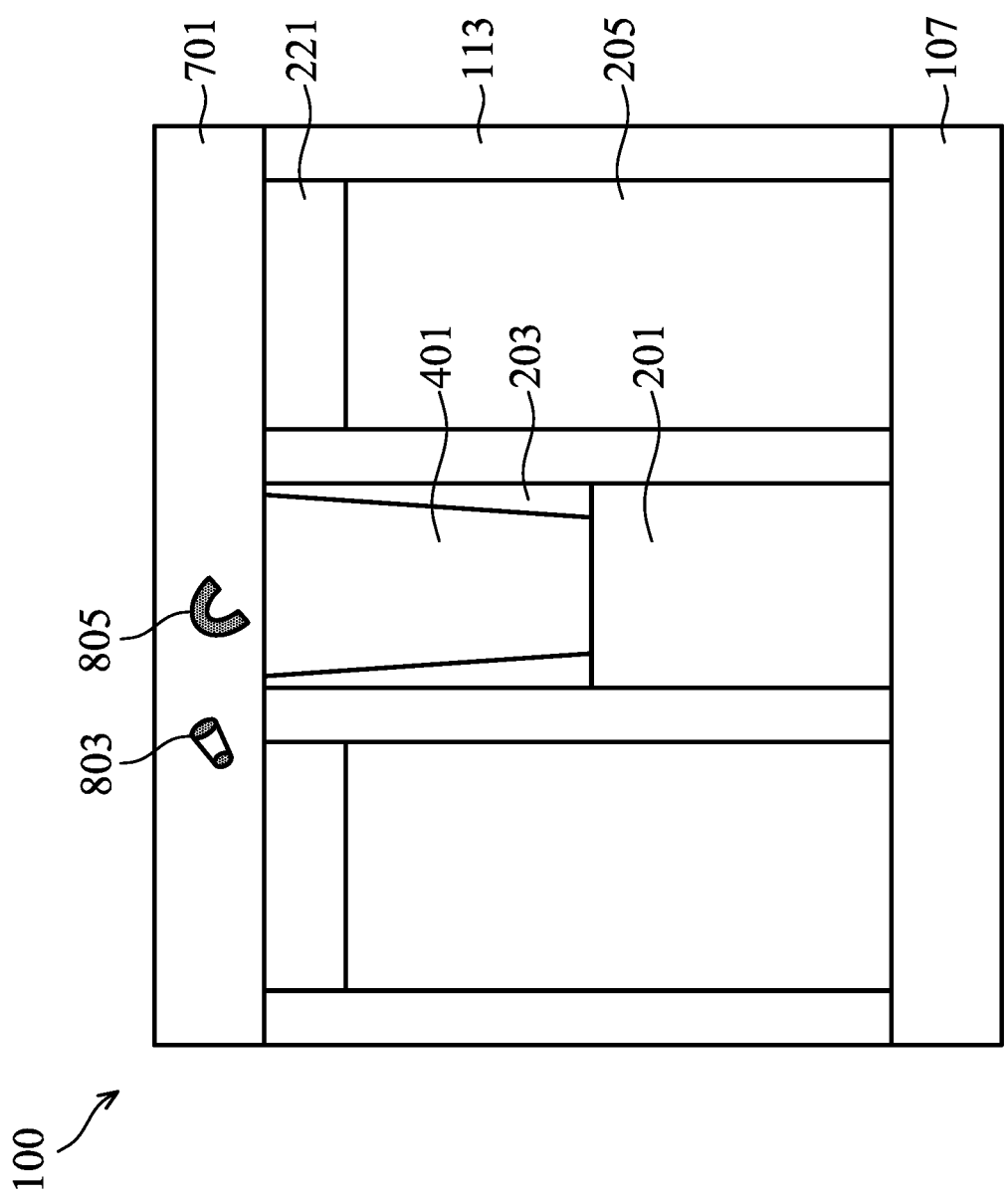

SEMICONDUCTOR DEVICE CLEANING SOLUTION, METHOD OF USE, AND METHOD OF MANUFACTURE

CROSS-REFERENCE TO RELATED APPLICATIONS

This application claims the benefit of U.S. Provisional Patent Application No. 62/592,891, filed on Nov. 30, 2017, entitled "Semiconductor Device Cleaning Solution, Method of Use, and Method of Manufacture," which patent application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C illustrate a CMP process and result in accordance with some embodiments.

FIG. 7 illustrates an application of a CMP cleaning solution in accordance with some embodiments.

DETAILED DESCRIPTION

Figure 1:
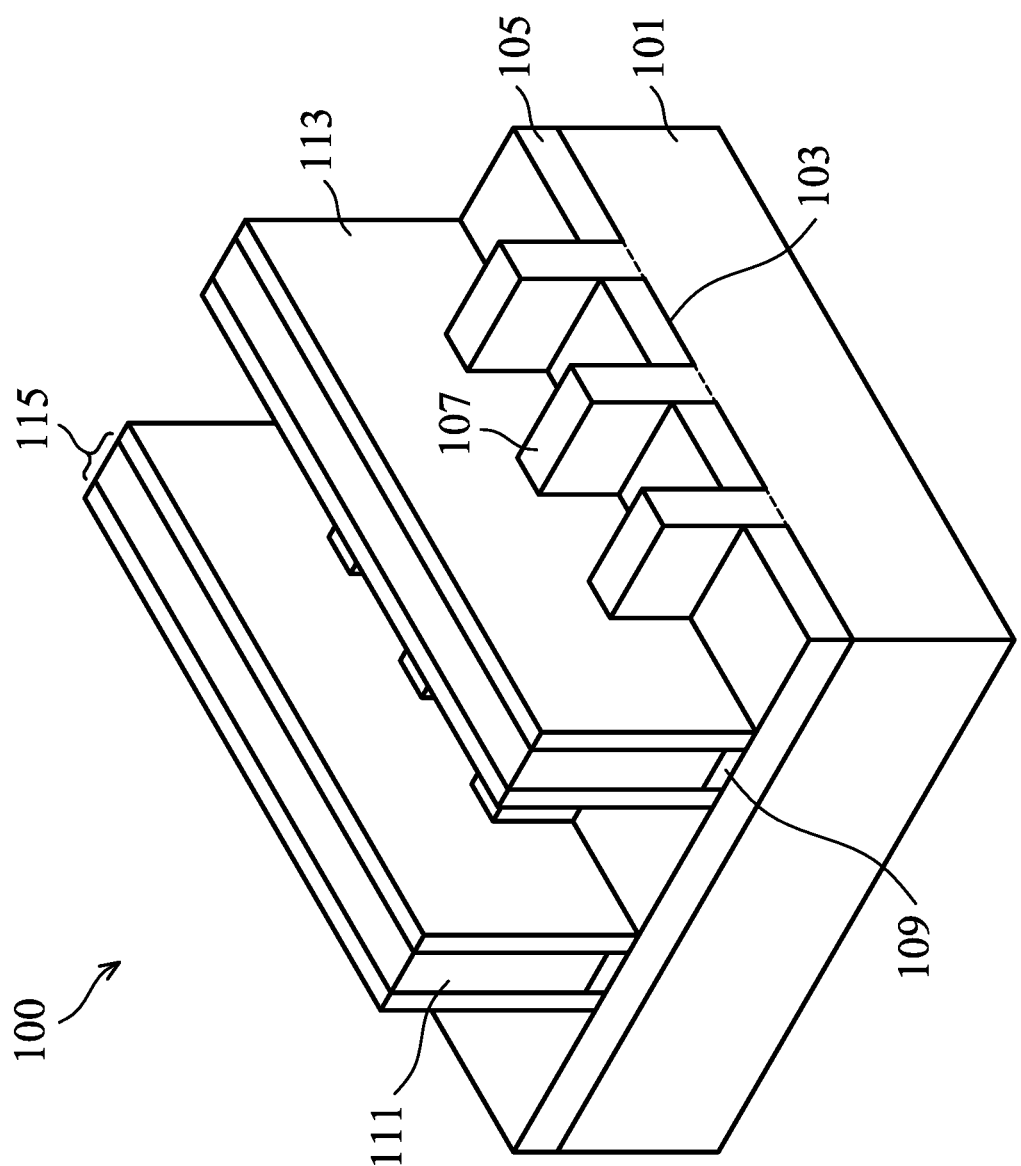
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100. The semiconductor device 100 may be a fin field-effect transistor (FinFET) device. However, in other embodiments, the methods described below may be applied to planar field-effect transistors (FETs), horizontal gate-all-around (HGAA) FETs, vertical gate-all-around (VGAA) FETs, or any other devices. In an embodiment, the semiconductor device 100 comprises a substrate 101 with first trenches 103 formed therein. The substrate 101 may be a silicon substrate, although other substrates, such as a semiconductor-on-insulator (SOI) substrate, a strained SOI substrate, a silicon germanium on insulator substrate, or the like could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a depositing, patterning, and developing a photoresist on the substrate 101, may be utilized to cover portions of the substrate 101 and expose other portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process forms fins 107 from those portions of the substrate 101 that remain unremoved. For convenience, the fins 107 have been illustrated in the figures as being separated from the substrate 101 by a dashed line, although a physical indication of the separation may or may not be present. These fins 107 may be used, as discussed below, to form channel regions of subsequently formed multiple-gate FinFET transistors. While FIG. 1 only illustrates three fins 107 formed from the substrate 101, any number of fins 107 may be utilized. The fins 107 may be spaced apart from one another such that each of the fins 107 forms a separate channel region, while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or any other suitable method of formation as is known in the art.

The first isolation regions 105 may be formed by over-filling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

After the first isolation regions 105 are formed, the dielectric material in the first isolation regions 105 may be recessed away from the top surfaces of the fins 107. The recessing may be performed to expose at least a portion of the sidewalls of the fins 107 adjacent the top surfaces of the fins 107. The dielectric material may be recessed using a wet etch by dipping the top surfaces of the fins 107 into an etchant such as HF, although other etchants, such as $H_2$, and other methods, such as a reactive ion etch, a dry etch with etchants such as $NH_3/NF_3$, a chemical oxide removal, a dry chemical clean, or the like may be used. The recessing may remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap-filling steps, combinations of these, or the like may also be utilized to form and fill the first trenches 103 with the dielectric material. All of the potential process steps are fully intended to be included within the scope of the present embodiment.

After the first isolation regions 105 have been formed, dummy gate dielectrics 109 are formed over the first isolation regions 105 and the fins 107, dummy gate electrodes 111 are formed over the dummy gate dielectrics 109, and first spacers 113 are formed on sidewalls of the dummy gate dielectrics 109 and the dummy gate electrodes 111. In an embodiment, the dummy gate dielectrics 109 may be formed by thermal oxidation, chemical vapor deposition (CVD), sputtering, or any other methods known and used in the art for forming a gate dielectric. Depending on the technique used to form the dummy gate dielectrics 109, the thickness of the dummy gate dielectrics 109 formed on top surfaces of the fins 107 may differ from the thickness of the dummy gate dielectrics 109 formed on sidewalls of the fins 107.

The dummy gate dielectrics 109 may comprise a material such as silicon dioxide or silicon oxynitride. The dummy gate dielectrics 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), zirconium oxide ($ZrO_2$), combinations thereof, or the like. Additionally, any combination of silicon dioxide, silicon oxynitride, and/or high-k materials may also be used for the dummy gate dielectrics 109.

The dummy gate electrodes 111 may comprise a conductive material and may be selected from a group comprising of W, Al, Cu, AlCu, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The dummy gate electrodes 111 may have non-planar top surfaces as deposited, and may be planarized prior to patterning the dummy gate electrodes 111 or prior to performing a gate etch. Ions may or may not be introduced into the dummy gate electrodes 111. Ions may be introduced, for example, by ion implantation techniques.

Once formed, the dummy gate dielectrics 109 and the dummy gate electrodes 111 may be patterned to form a series of dummy gate stacks 115 over the fins 107. The dummy gate stacks 115 define multiple channel regions located on each side of the fins 107 beneath the dummy gate dielectrics 109. The dummy gate stacks 115 may be formed by depositing and patterning a gate mask (not separately illustrated) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrodes 111 and the dummy gate dielectrics 109 may be etched using a dry etching process to form the patterned dummy gate stacks 115.

Once the dummy gate stacks 115 have been patterned, the first spacers 113 may be formed. The first spacers 113 may be formed on opposing sides of the dummy gate stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, or the like and may be formed by methods utilized to form such a layer, such as chemical vapor deposition (CVD), plasma enhanced CVD, sputter deposition, and other methods known in the art. The spacer layer may comprise a different material with different etch characteristics or the same material as the dielectric material within the first isolation regions 105. The spacer layer may then be patterned, such as by one or more etches to remove the spacer layer from the horizontal surfaces of the structure, forming the first spacers 113.

Figure 2A:
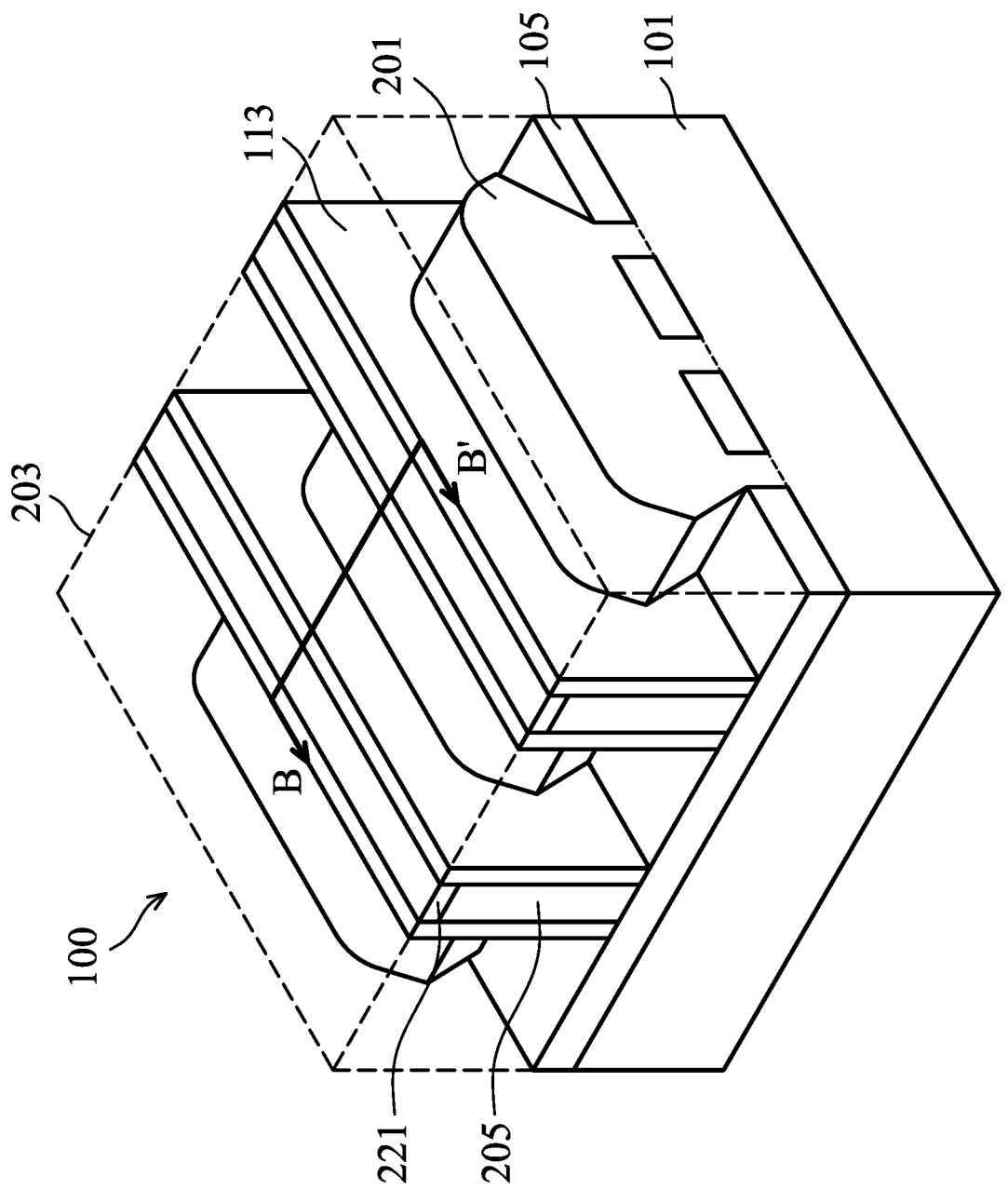
FIGS. 2A-2B illustrate formation of source/drain regions in accordance with some embodiments.
Figure 2B:
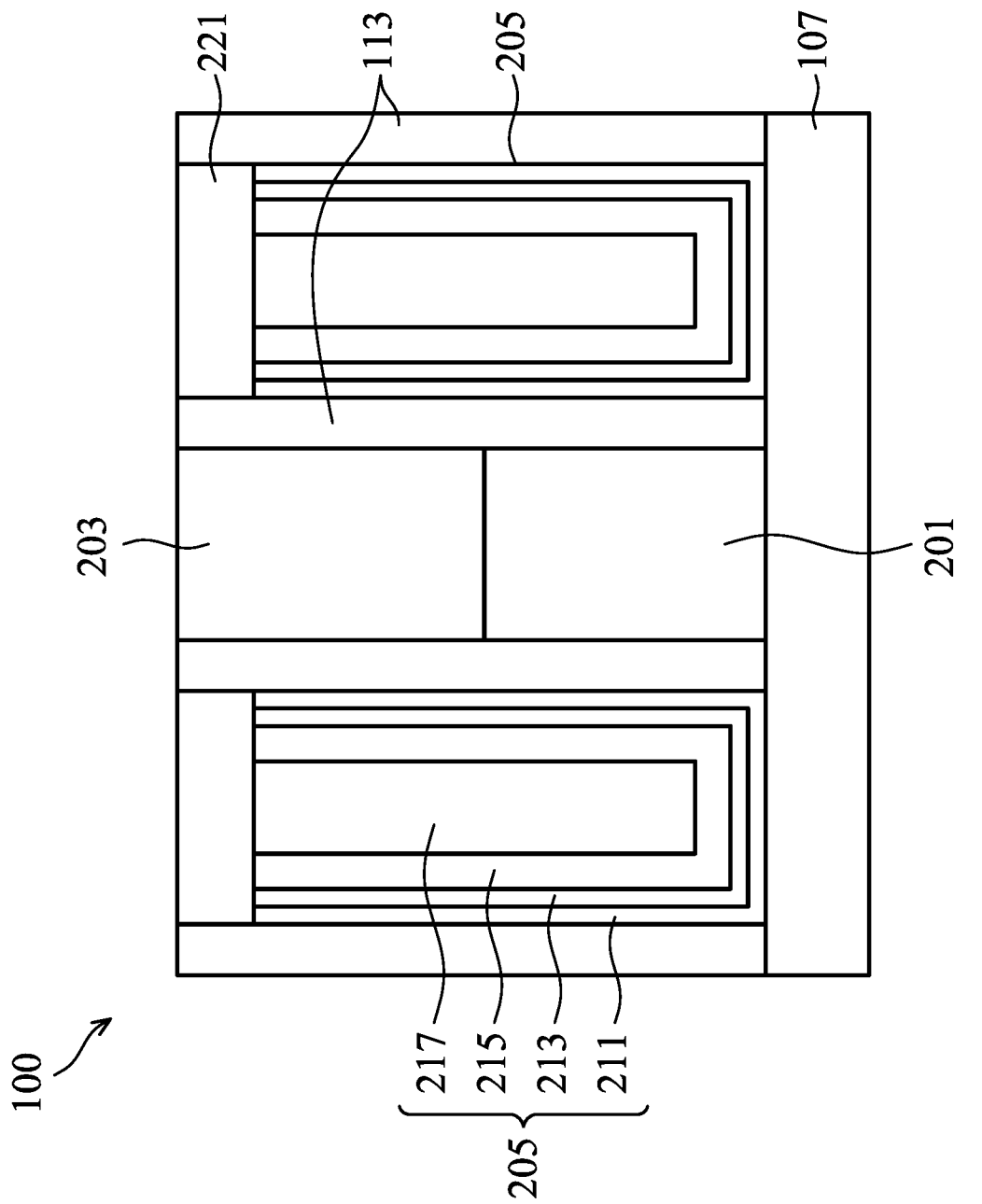

FIGS. 2A-2B illustrate a removal of the fins 107 from those areas not protected by the dummy gate stacks 115 and the first spacers 113 and a growth of source/drain regions 201 (with FIG. 2B illustrating a cross-sectional view of FIG. 2A along line B-B'). The removal of the fins 107 from those areas not protected by the dummy gate stacks 115 and the first spacers 113 may be performed by a reactive ion etch (RIE) using the dummy gate stacks 115 and the first spacers 113 as hard masks, or by any other suitable removal process. The removal may be continued until the fins 107 are planar with top surfaces of the first isolation regions 105 or recessed below the top surfaces of the first isolation regions 105.

The source/drain regions 201 may then be grown on the fins 107. The source/drain regions 201 may be grown to form stressors that will impart stress into the channel regions of the fins 107 located underneath the dummy gate stacks 115. In an embodiment, wherein the fins 107 include silicon and the FinFET is a p-type device, the source/drain regions 201 may be regrown through a selective epitaxial process with a material such as silicon or silicon germanium that has a different lattice constant than the channel regions. The epitaxial growth process may use precursors such as silane, dichlorosilane, germane, and the like, and may continue for between about 5 minutes and about 120 minutes, such as about 30 minutes. In other embodiments, the source/drain regions 201 may comprise materials such as GaAs, GaP, GaN, InP, InAs, InSb, GaAsP, AlGaN, AlInAs, AlGaAs, GaInAs, GaInP, GaInAsP, combinations thereof, or the like.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. According to various embodiments, n-type dopants such as phosphorous, arsenic, antimony, or the like may be implanted to form an NMOS device. These dopants may be implanted using the dummy gate stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

FIG. 2A also illustrates a formation of an inter-layer dielectric (ILD) layer 203 (illustrated in dashed lines in FIG. 2A to illustrate the underlying structures) over the dummy gate stacks 115 and the source/drain regions 201. The ILD layer 203 may include silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The ILD layer 203 may be formed using a process such as PECVD, although other processes, such as LPCVD, may be used. Once formed, the ILD layer 203 may be planarized with the first spacers 113 using, e.g., a planarization process such as chemical mechanical polishing, although any suitable process may be utilized.

After the formation of the ILD layer 203, the material of the dummy gate electrodes 111 and the dummy gate dielectrics 109 may be removed and replaced to form gate stacks 205. In an embodiment, the dummy gate electrodes 111 may be removed using, e.g., a wet or dry etching process that utilizes etchants that are selective to the material of the dummy gate electrodes 111. However, any suitable removal process may be utilized.

Once the dummy gate electrodes 111 have been removed, the openings left behind may be refilled to form the gate stacks 205. In a particular embodiment, the gate stacks 205 include first dielectric material 211, first metal material 213, second metal material 215, and third metal material 217. In an embodiment, the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like.

The first metal material 213 may be formed adjacent to the first dielectric material 211 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 213 may be referred to as a first work function layer. The first metal material 213 may be deposited using a deposition process such as atomic layer deposition, chemical vapor deposition, sputtering, or the like, although any suitable deposition process may be used.

The second metal material 215 may be formed adjacent to the first metal material 213 and, in a particular embodiment, may be similar to the first metal material 213. For example, the second metal material 215 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The second metal material 215 may be referred to as a second work function layer. Additionally, the second metal material 215 may be deposited using a deposition process such as atomic layer deposition, chemical vapor deposition, sputtering, or the like, although any suitable deposition process may be used.

In the above embodiments, the gate stacks 205 include two work function layers (e.g., the first metal material 213 and the second metal material 215); however, the disclosure is not limited thereto. In some embodiments, the gate stacks 205 may include one work function layer, or more than two work function layers. For NMOS devices, the first metal material 213 and the second metal material 215 may include Ti, Ag, Al, TiAlMo, Ta, TaN, TiAlC, TiAlN, TaC, TaCN, TiAl, TaSiN, Mn, Zr, or combinations thereof. For PMOS devices, the first metal material 213 and the second metal material 215 may include TiN, W, Ta, Ni, Pt, Ru, Mo, Al, WN, or combinations thereof.

The third metal material 217 fills a remainder of the openings left behind by the removal of the dummy gate electrodes 111. In an embodiment, the third metal material 217 is a metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the openings left behind by the removal of the dummy gate electrodes 111. Any suitable material and deposition process may be used for the third metal material 217.

Once the openings left behind by the removal of the dummy gate electrodes 111 have been filled, the materials may be planarized in order to remove any material that is outside of the openings left behind by the removal of the dummy gate electrodes 111. In a particular embodiment, the removal may be performed using a planarization process such as chemical mechanical polishing. However, any suitable planarization and removal process may be utilized.

After the materials of the gate stacks 205 have been formed and planarized, the materials of the gate stacks 205 may be recessed and capped with a capping layer 221. In an embodiment, the materials of the gate stacks 205 may be recessed using, e.g., a wet or dry etching process that utilizes etchants selective to the materials of the gate stacks 205; however, any suitable process may be used to etch the gate stacks 205.

Once the materials of the gate stacks 205 have been recessed, the capping layer 221 may be deposited and planarized along with the first spacers 113. In an embodiment, the capping layer 221 is a material such as SiN, SiON, SiCON, SiC, SiOC, combinations of these, or the like, deposited using a deposition process such as atomic layer deposition, chemical vapor deposition, sputtering, or the like. The capping layer 221 may be deposited and then planarized using a planarization process such as chemical mechanical polishing (CMP) such that the capping layer 221 is planar with the first spacers 113.

Figure 3:
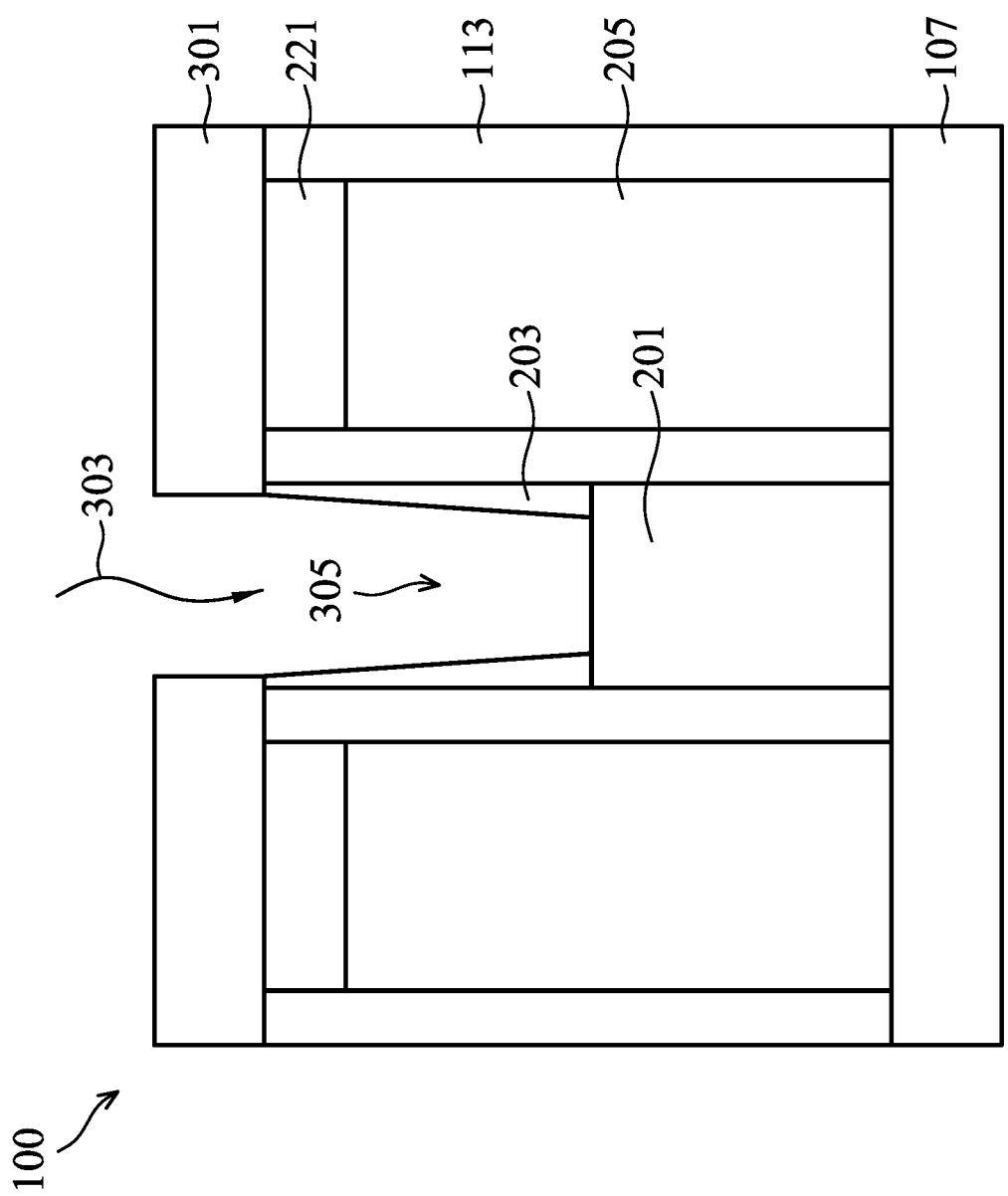
FIG. 3 illustrates a formation of a first opening in accordance with some embodiments.

FIG. 3 illustrates a formation of a first opening 305 through the ILD layer 203 in order to expose the source/drain regions 201 in preparation for formation of a first contact 401 (not illustrated in FIG. 3 but illustrated and described below with respect to FIG. 4). Additionally, for convenience, the gate stack 205 is illustrated in a simplified form without showing the additional layers. In an embodiment, the first opening 305 may be formed by initially placing and patterning a hardmask 301 over the source/drain regions 201. In an embodiment, the hardmask 301 may be a dielectric material such as silicon nitride, although any suitable masking material may be utilized.

Once the hardmask 301 has been placed, the hardmask 301 is patterned. In an embodiment, hardmask 301 may be patterned by depositing and then exposing a photosensitive material onto the hardmask 301. The impact of the energy will cause a chemical reaction in those parts of the photosensitive material that were impacted by the patterned energy source, thereby modifying the physical properties of the exposed portions of the photoresist such that the physical properties of the exposed portions of the photosensitive material are different from the physical properties of the unexposed portions of the photosensitive material. The photosensitive material may then be developed with, e.g., a developer (not separately illustrated), in order to separate the exposed portion of the photosensitive material from the unexposed portion of the photosensitive material, and then the hardmask 301 may be patterned using an anisotropic etch and the photosensitive material as a mask.

Once the hardmask 301 has been patterned, the first opening 305 may be formed using the hardmask 301 as a mask. In an embodiment, the first opening 305 may be formed using a first etching process 303 (represented in FIG. 3 by a wavy line), which may be an anisotropic etching process such as a reactive ion etch process. However, any suitable process, such as a wet etching process, and any suitable reactants may be used. As illustrated in FIG. 3, the first opening 305 may expose an upper surface of the source/drain region 201. In other embodiments, the first opening 305 may extend at least partially into the source/drain region 201, such that the upper surface of the source/drain region 201 is recessed. As further illustrated in FIG. 3, the first opening 305 may have a first width at a point adjacent to an upper surface of the ILD layer 203 and a second width at a point adjacent the bottom surface of the ILD layer 203, wherein the first width is greater than the second width.

Once the first opening 305 has been formed, the hardmask 301 may be removed. In an embodiment, the hardmask 301 may be removed using, e.g., a wet or dry etching process that uses an etchant selective to the material of the hardmask 301. However, any suitable removal process may also be utilized.

Figure 4:
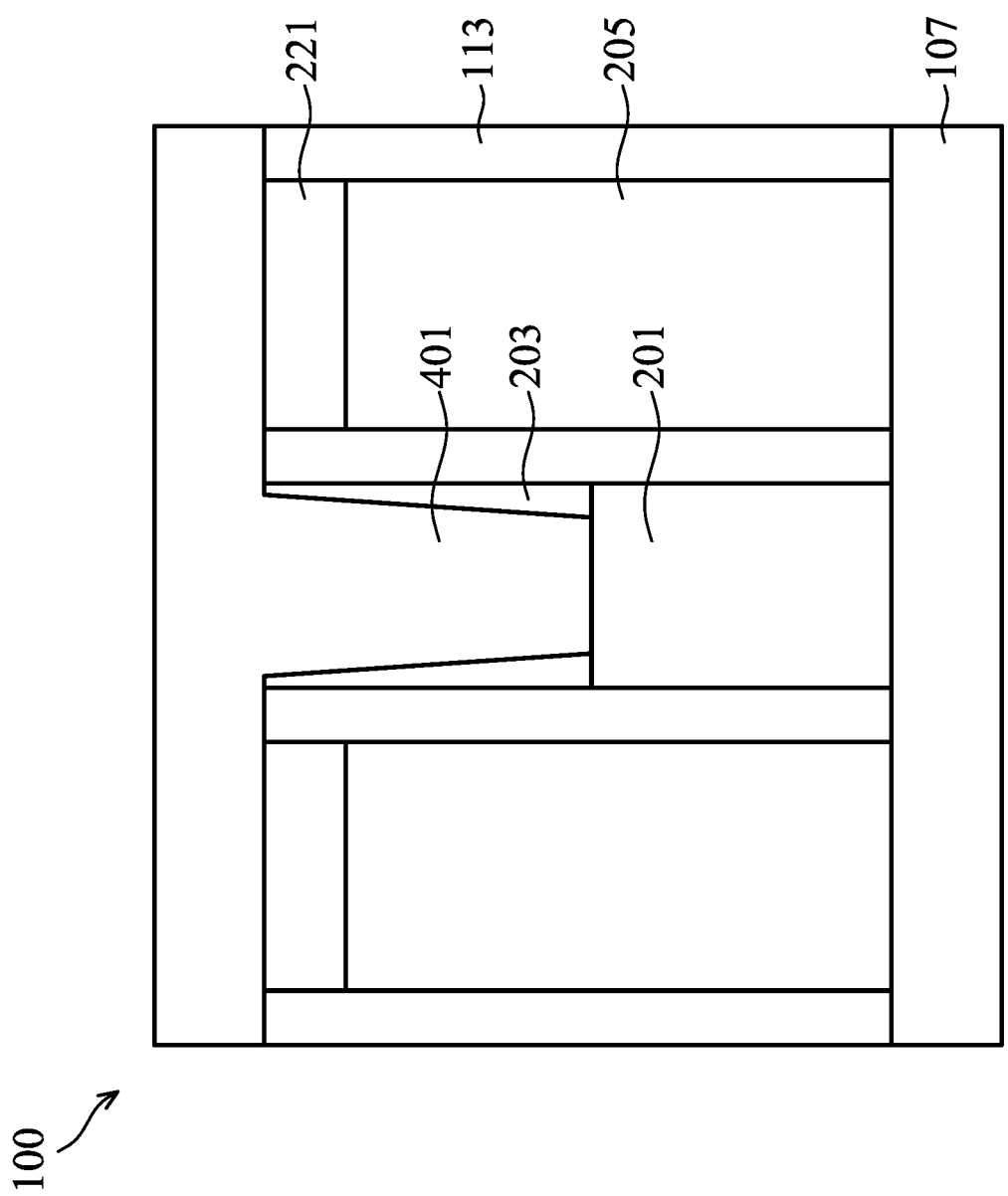
FIG. 4 illustrates a formation of a first contact in accordance with some embodiments.

FIG. 4 illustrates a formation of the first contact 401. Optionally, prior to formation of the first contact 401, a silicide contact (not separately illustrated) may be formed. The silicide contact may include titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step, which causes the metal to react with the underlying exposed silicon. Unreacted metal is then removed, such as with a selective etch process.

In an embodiment, the first contact 401 may be a conductive material such as Co, W, Al, Cu, Ti, Ta, Ru, TiN, TiAl, TiAlN, TaN, TaC, NiSi, CoSi, combinations of these, or the like, although any suitable material may be deposited into the first opening 305 using a deposition process such as sputtering, chemical vapor deposition, electroplating, electroless plating, or the like, to fill and/or overfill the first opening 305 formed by the first etching process 303. Once filled or overfilled, any deposited material outside of the first opening 305 formed by the first etching process 303 may be removed using a planarization process such as chemical mechanical polishing (CMP). However, any suitable material and process of formation may be utilized.

Figure 5:
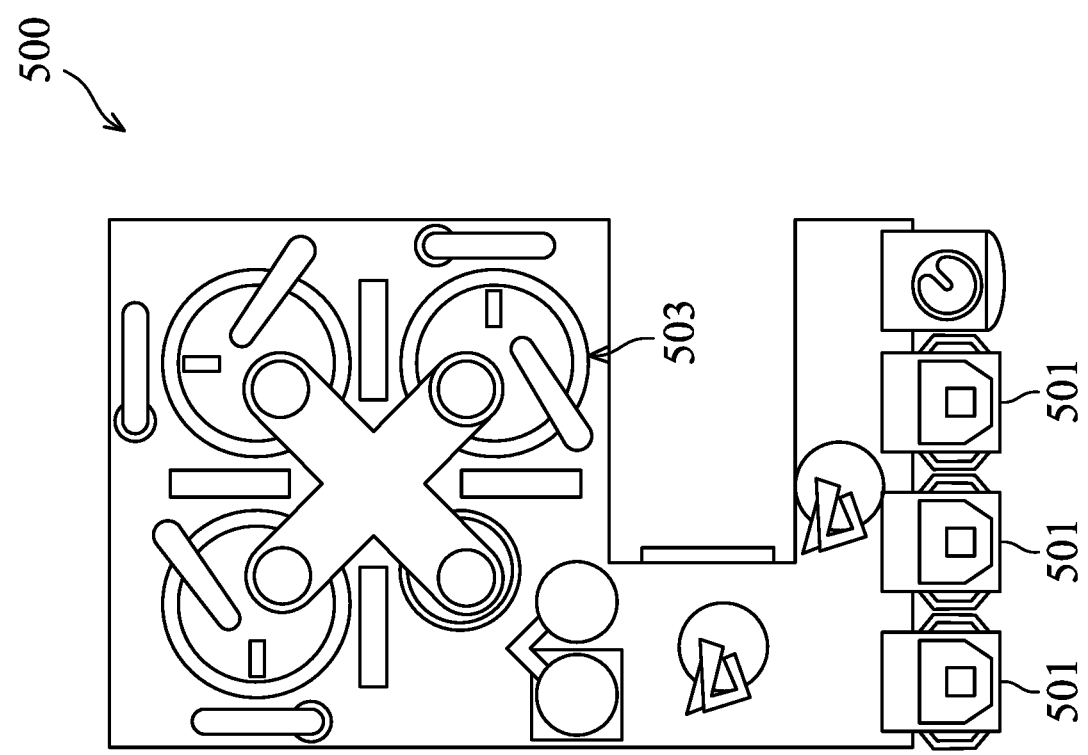
FIG. 5 illustrates a chemical mechanical polishing (CMP) system in accordance with some embodiments.

FIG. 5 illustrates a CMP system 500, which may be used to remove the excess conductive material of the first contact 401 from the surface of the capping layer 221 and the first spacers 113, thereby isolating the first contact 401 in the first opening 305. The CMP system 500 may include loadlocks 501 and one or more platens 503. The loadlocks 501 may be used for loading the substrate 101 into the CMP system 500, and then unloading the substrate 101 once the CMP process has been completed. The platens 503 may be used for polishing and removing the conductive material of the first contact 401 in one or more steps.

FIGS. 6A-6C illustrate a CMP process 600 and the result of the CMP process 600. In an embodiment, the substrate 101 (along with the overfilled conductive material of the first contact 401) may be loaded into the CMP system 500 through the loadlocks 501 and passed to the platens 503 for a removal of the conductive material of the first contact 401 (see FIG. 5). Once at the platens 503 (and as illustrated in FIG. 6A), the substrate 101 may be connected to a first carrier 601, which faces the substrate 101 and the first contact 401 towards a first polishing pad 603 connected to one of the platens 503.

The first polishing pad 603 may be a hard polishing pad that may be utilized for a relatively quick removal of the conductive material of the first contact 401. In an embodiment, the first polishing pad 603 may be a single layer or composite layer of materials such as polyurethane or polyurethane mixed with fillers, and may have a hardness of about 50 or greater on the Shore D Hardness scale. The surface of the first polishing pad 603 may be a roughened surface with micropores within it. However, any other suitable polishing pad may be used to remove the conductive material of the first contact 401 from the surface of the capping layer 221 and the first spacers 113 (as illustrated in FIG. 6B).

During the CMP process 600 the first carrier 601 may press the surface of the first contact 401 against the first polishing pad 603. The substrate 101 and the first polishing pad 603 are each rotated against each other, either in the same direction or else counter-rotated in opposite directions. By rotating the first polishing pad 603 and the substrate 101 against each other, the first polishing pad 603 mechanically grinds away the conductive material of the first contact 401, thereby effectuating a removal of the conductive material of the first contact 401. Additionally, in some embodiments the first carrier 601 may move the substrate 101 back and forth along a radius of the first polishing pad 603.

Additionally, the mechanical grinding of the first polishing pad 603 may be assisted by use of a CMP slurry 605, which may be dispensed onto the first polishing pad 603 through a slurry dispensing system 607. In an embodiment, the CMP slurry 605 may comprise a first reactant, a first inhibitor (e.g., a CMP inhibitor), an abrasive, a first surfactant, and a first solvent. The first reactant may be a chemical that will chemically react with the conductive material of the first contact 401 in order to assist the first polishing pad 603 in grinding away the conductive material of the first contact 401, such as an oxidizer. The first reactant may be hydrogen peroxide, although any other suitable reactant, such as hydroxylamine, periodic acid, ammonium persulfate, other periodates, iodates, peroxomonosulfates, peroxymonosulfuric acid, perborates, malonamide, combinations of these, and the like, that will aid in the removal of the conductive material of the first contact 401 may be utilized.

The first inhibitor may be any suitable chemical that will help to prevent corrosion or excess etching of the conductive material of the first contact 401 in order to enhance CMP performance (e.g., prevent dishing). In an embodiment, the first inhibitor may include phosphoric esters, sulfuric esters, tetrazoles, diazoles, triazoles, combinations of these, or the like. However, these embodiments are not intended to be limited to these inhibitors, as any suitable inhibitor may be utilized as the first inhibitor.

The abrasive may be any suitable particulate that, in conjunction with the first polishing pad 603, aids in the removal of the conductive material of the first contact 401. In an embodiment, the abrasive may be silica (e.g., silicon oxide) with a particle size of between about 0.1 μm and about 150 nm. However, any other suitable abrasive, such as aluminum oxide, cerium oxide, polycrystalline diamond, polymer particles such as polymethacrylate or polymethacryclic, combinations of these, or the like, may be utilized and are fully intended to be included within the scope of the embodiments.

The first surfactant may be utilized to help disperse the first reactant and abrasive within the CMP slurry 605 and prevent the abrasive from agglomerating during the CMP process. In an embodiment, the first surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, potassium oleate, sulfosuccinates, sulfosuccinate derivatives, sulfates of alcohols, alkylanyl sulfonates, carboxylated alcohols, sulfonated amines, sulfonated amides, alkylamino propionic acids, alkyliminodipropionic acids, combinations of these, or the like. However, these embodiments are not intended to be limited to these surfactants, as any suitable surfactant may be utilized as the first surfactant.

The remainder of the CMP slurry 605 may be a first solvent that may be utilized to combine the first reactant, the first inhibitor, the abrasive, and the first surfactant and allow the mixture to be moved and dispersed onto the first polishing pad 603. In an embodiment, the first solvent of the CMP slurry 605 may be a solvent such as deionized water or an alcohol. However, any other suitable solvent may be utilized.

Once combined, the CMP slurry 605 may be dispensed onto the first polishing pad 603 by the slurry dispensing system 607 in order to assist in the removal of the conductive material of the first contact 401. The first reactant may react with the material of the first contact 401 to form a sacrificial oxide layer including the material of the first contact 401 (not shown) along the exposed surface of the conductive material of the first contact 401. The sacrificial oxide layer may then be removed by the grinding effect of the first polishing pad 603 along with the assistance of the abrasives within the CMP slurry 605. Using this process, a removal of the conductive material of the first contact 401 may be performed, and may be continued until the conductive material of the first contact 401 is removed from the upper surface of the capping layer 221 and the first spacers 113, and the capping layer 221 and the first spacers 113 are exposed.

Following the CMP process 600, the CMP slurry 605 may be removed from the top surface of the substrate 101. For example, the CMP slurry 605 may be removed from the surface of the substrate 101 by ceasing dispensing of the CMP slurry 605 from the slurry dispensing system 607 while the first carrier 601 continues to rotate the substrate 101.

FIG. 6B illustrates the result of the CMP process 600. As illustrated, the CMP process 600 removes the conductive material of the first contact 401 from the surface of the capping layer 221 and the first spacers 113, and the first contact 401 is isolated within the first opening 305. However, as one of ordinary skill in the art will recognize, the above description of a removing of the excess conductive material of the first contact 401 outside of the first opening 305 in a single processing step is merely an illustrative example and is not intended to be limiting upon the embodiments. Any number of removal processes and any number of platens may be utilized to remove the conductive material of the first contact 401, such as a bulk CMP process on a first platen, a fine CMP process on a second platen, and a buffing CMP process on a third platen, and all such combinations are fully intended to be included within the scope of the embodiments.

FIG. 6C (although not to scale) illustrates an enlarged view of the surface of the first contact 401 following the CMP process 600. As illustrated, following the CMP process 600, a plurality of individual inhibitor molecules 615 of the first inhibitor may be left on the surface of the first contact

401. The first contact 401 includes a plurality of conductive material atoms 613 disposed at an outermost surface of the first contact 401 and a bulk conductive material 611 making up the remainder of the first contact 401. The inhibitor molecules 615 are bonded or otherwise attached to the plurality of conductive material atoms 613, while the conductive material atoms 613 are bonded to the bulk conductive material 611.

Following the CMP process 600, the inhibitor molecules 615 may cause various problems in subsequent processing systems if they are not removed or are incompletely removed from the surface of the first contact 401. For example, the inhibitor molecules 615 may affect the wettability and cleanability of the first contact 401, may interfere with subsequent steps (e.g., chemical vapor deposition), may provide poor adhesion to deposited layers, or the like.

FIG. 7 illustrates an application of a CMP cleaning solution 701 on the top surface of the substrate 101. The CMP cleaning solution 701 may be used in a cleaning process to clean the surface of the substrate 101. More specifically, the CMP cleaning solution 701 may be used to remove the inhibitor molecules 615 and any other residue from the CMP process 600 from the surface of the first contact 401.

The CMP cleaning solution 701 may be applied to the top surface of the substrate 101. More specifically, the CMP cleaning solution 701 may be applied on the top surfaces of the first contact 401, the first spacers 113, and the capping layer 221. The CMP cleaning solution 701 may be applied through a nozzle in a spin-on process; although any suitable application, such as a brush, a sponge, a pencil brush, combinations of these, or the like may be used. The CMP cleaning solution 701 may be applied continuously throughout the cleaning process, or may be applied intermittently. The CMP cleaning solution may be applied at a flow rate of between about 0 ml/min and about 2500 ml/min, such as about 1500 ml/min.

During the cleaning process, the top surface of the substrate 101 may be scrubbed by a scrubber (not separately illustrated). The scrubber may be a brush, a sponge, a pencil brush, combinations thereof, or the like. The substrate 101 and the scrubber may each be rotated against each other, either in the same direction or else counter-rotated in opposite directions. By rotating the scrubber and the substrate 101 against each other, the scrubber mechanically cleans away residue from the CMP slurry 605 left on the surface of the first contact 401, thereby helping to effectuate a cleaning of the first contact 401. The cleaning process may be performed at a temperature of between about 10° C. and about 35° C., such as about 25° C. The cleaning process may be continuous or intermittent, and may continue for about 30 seconds, about 60 seconds, less than a minute, or any other time.

The CMP cleaning solution 701 may comprise a plurality of chelator molecules 805, a plurality of carrier molecules 803, a second inhibitor, a second surfactant, and a second solvent. The chelator molecules 805 are used to remove the conductive material atoms 613 and the inhibitor molecules 615 from the surface of the bulk conductive material 611. For example, the chelator molecules 805 may attack the conductive material atoms 613 and bond to the conductive material atoms 613 to remove the conductive material atoms 613 and the inhibitor molecules 615 from the surface of the bulk conductive material 611.

In an embodiment, the chelator molecules 805 may comprise histidine, aspartic acid, and glycine, combinations of these, or the like. The chelator molecules 805 may comprise about 2 percent by weight or less than about 2 percent by weight of the CMP cleaning solution 701. These embodiments are not intended to be limited to these chelator molecules, as any suitable chelator molecules may be utilized as the chelator molecules 805.

The plurality of carrier molecules 803 are used to prevent the inhibitor molecules 615 from re-bonding or otherwise re-attaching to the surface of the bulk conductive material 611 once the inhibitor molecules 615 have been removed from the surface of the bulk conductive material 611 by the chelator molecules 805. The carrier molecules 803 may be referred to as ring-shaped molecules, a host, or an encapsulant. The carrier molecules 803 may form host-guest complexes with the inhibitor molecules 615 or encapsulate the inhibitor molecules 615 such that the inhibitor molecules 615 are solubilized in the cleaning solution 701.

The carrier molecules 803 may include at least one ring and may be ring-shaped molecules. The exterior and an interior cavity of the carrier molecules 803 may have different hydrophilicities. For example, in some embodiments, the exterior of the carrier molecules 803 may be hydrophilic and the interior cavity may be less hydrophilic. In some other embodiments, the exterior of the carrier molecules 803 may be hydrophilic and the interior cavity may be hydrophobic. Thus the inhibitor molecules 615, which may be hydrophobic, may be bonded with, physically adsorbed on, or otherwise encapsulated within the interior cavity of the carrier molecules 803, while the exterior of the complex of the carrier molecules 803 and the inhibitor molecules 615 remains water-soluble.

According to various embodiments, the carrier molecules 803 may be selected based on the size of the inhibitor molecules 615. For example, the carrier molecules 803 may be selected such that the size of the interior cavity corresponds to the size of the inhibitor molecules 615.

Accordingly, in an embodiment in which the inhibitor molecules 615 comprise phosphoric esters, the carrier molecules 803 may comprise cyclodextrines, cucurbiturils, calixarenes, pillararenes, combinations of these, or the like. According to an embodiment, the carrier molecules 803 may comprise α-cyclodextrin (e.g., a 6-membered cyclodextrin molecule), β-cyclodextrin (e.g., a 7-membered cyclodextrin molecule), γ-cyclodextrin (e.g., a 8-membered cyclodextrin molecule), combinations thereof, or the like.

α-cyclodextrin, β-cyclodextrin, and γ-cyclodextrin each have different-sized interior cavities. Thus, in various embodiments, the cleaning solution 701 may comprise any combination of α-cyclodextrin, β-cyclodextrin, and γ-cyclodextrin depending on the size of the inhibitor molecules 615 present in the CMP slurry 605. For example, the cleaning solution 701 may comprise between 0 and about 5 weight percent α-cyclodextrin, such as about 1 weight percent α-cyclodextrin; between 0 and about 5 weight percent β-cyclodextrin, such as about 1 weight percent β-cyclodextrin; and between 0 and about 5 weight percent γ-cyclodextrin, such as about 1 weight percent γ-cyclodextrin. However, any suitable combination may be utilized.

The carrier molecules 803 may comprise less than about 10 percent by weight of the CMP cleaning solution 701. For example, the carrier molecules 803 may comprise about 1 percent by weight of the CMP cleaning solution 701. These embodiments are not intended to be limited to these carrier molecules, as any suitable carrier molecule may be utilized as the plurality of carrier molecules 803.

The second inhibitor is an inhibitor different from the first inhibitor. The second inhibitor may be any suitable chemical that will prevent the inhibitor molecules 615 removed from the surface of the bulk conductive material 611 by the chelator molecules 805 from aggregating and redepositing on the surface of the bulk conductive material 611. Molecules of the second inhibitor may bond with molecules of the inhibitor molecules 615 removed from the surface of the bulk conductive material 611, thereby disrupting pi-pi interactions between the inhibitor molecules 615 and the molecules of the bulk conductive material 611. In an embodiment, the second inhibitor may comprise benzotriazole, aniline, and pyridine, combinations of these, or the like.

The presence of the carrier molecules 803 in the cleaning solution 701 may help to reduce the amount of the second inhibitor used in the cleaning solution 701. For example, when the carrier molecules 803 are included in the cleaning solution 701, the second inhibitor may comprise about 1 percent by weight or less than about 1 percent by weight of the CMP cleaning solution 701. These embodiments are not intended to be limited to these inhibitors, as any suitable inhibitor different from the first inhibitor may be utilized as the second inhibitor.

The second surfactant may be utilized to help disperse the chelator molecules 805, the carrier molecules 803, and the second inhibitor within the CMP cleaning solution 701 and also prevent the components of the CMP cleaning solution 701 from agglomerating during the cleaning process. In an embodiment, the second surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, potassium oleate, sulfosuccinates, sulfosuccinate derivatives, sulfates of alcohols, alkylanyl sulfonates, carboxylated alcohols, sulfonated amines, sulfonated amides, alkylamino propionic acids, alkyliminodipropionic acids, combinations of these, or the like. The second surfactant may comprise about 2 percent by weight or less than about 2 percent by weight of the CMP cleaning solution 701. These embodiments are not intended to be limited to these surfactants, as any suitable surfactant may be utilized as the second surfactant.

The remainder of the CMP cleaning solution 701 may be a second solvent that may be utilized to combine the chelator molecules 805, the carrier molecules 803, the second inhibitor, and the second surfactant and allow the mixture to be moved and dispersed onto the surface of the substrate 101. In an embodiment, the second solvent may be a solvent such as deionized water or an alcohol. However, any other suitable solvent may be utilized.

Following the cleaning process, the CMP cleaning solution 701 may be removed from the top surface of the substrate 101. For example, the CMP cleaning solution 701 may be removed from the top surface of the substrate 101 by discontinuing the application of the CMP cleaning solution 701 while the continuing to rotate the substrate 101.

Figure 8A:
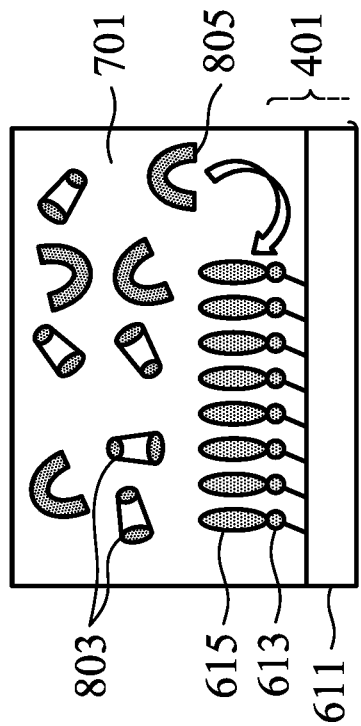
FIGS. 8A-8D illustrate a cleaning process in accordance with some embodiments.

FIGS. 8A-8D (although not to scale) illustrate enlarged views of the cleaning process utilizing the CMP cleaning solution 701. FIG. 8A illustrates the surface of the first contact 401 following the deposition of the CMP cleaning solution 701. As shown in FIG. 8A, the surface of the first contact 401 comprises inhibitor molecules 615 bonded or otherwise attached to conductive material atoms 613, which, in turn, are bonded to the bulk conductive material 611. The CMP cleaning solution 701 comprises carrier molecules 803 and chelator molecules 805. In some embodiments, the carrier molecules 803 may be referred to as hosts.

Figure 8B:
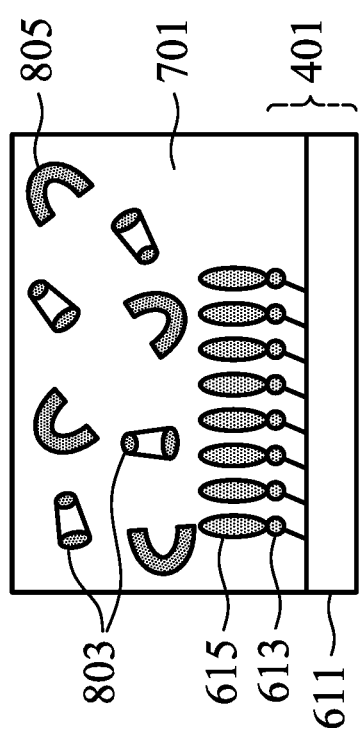

FIG. 8B illustrates one of the chelator molecules 805 attacking one of the conductive material atoms 613. Each of the chelator molecules 805 may attack one of the conductive material atoms 613 to remove the conductive material atom 613 and one of the inhibitor molecules 615 attached to the conductive material atom 613 from the bulk conductive material 611. The chelator molecules 805 may remove all of the conductive material atoms 613 or at least some of the conductive material atoms 613 from the bulk conductive material 611. According to at least one embodiment, the chelator molecules 805 may remove a one-atom thick layer of the conductive material atoms 613 from the bulk conductive material 611 such that the surface of the bulk conductive material 611 is free of the inhibitor molecules 615. The chelator molecules 805 may remove the conductive material atoms 613 and the inhibitor molecules 615 from the surface of the bulk conductive material 611 by bonding with, binding, or otherwise attaching to the conductive material atoms 613.

Figure 8C:
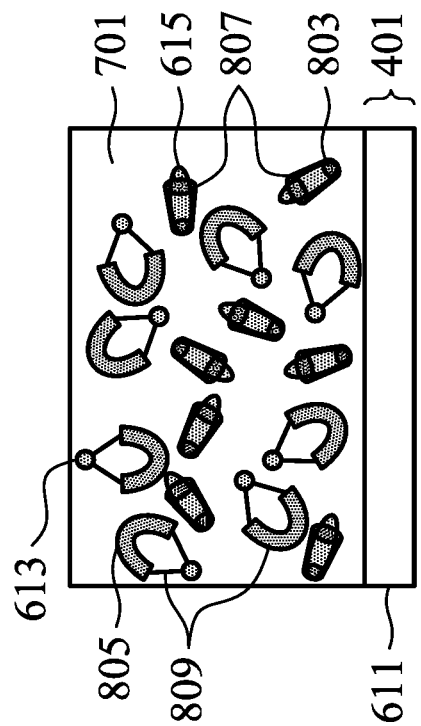

FIG. 8C illustrates one of the inhibitor molecules 615 bonded to one of the carrier molecules 803 and one of the conductive material atoms 613 bonded to one of the chelator molecules 805. After the conductive material atoms 613 and the inhibitor molecules 615 are removed from the bulk conductive material 611, the chelator molecules 805 may bond to the conductive material atoms 613 to form a plurality of chelator complexes 809. The inhibitor molecules 615, now free from the conductive material atoms 613, may be encapsulated by, bonded to, physically adsorbed by or otherwise attached to the interior cavity of the carrier molecules 803 to form a plurality of host-guest complexes 807. More specifically, the inhibitor molecules 615 may be hydrophobic, the interior cavity of the carrier molecules 803 may be hydrophobic, and the inhibitor molecules 615 may bind to, be encapsulated by, or be physically adsorbed onto the interior cavity of the carrier molecules 803.

Figure 8D:
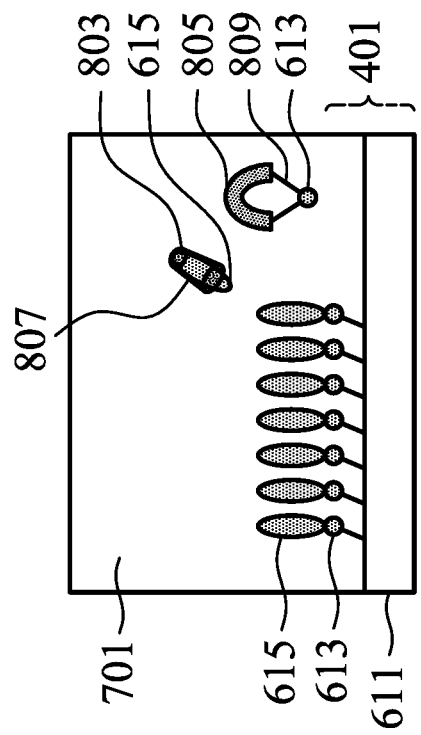

FIG. 8D illustrates the host-guest complexes 807 and the chelator complexes 809 in the CMP cleaning solution 701 after all of the conductive material atoms 613 have been removed from the surface of the bulk conductive material 611. As shown in FIG. 8D, the inhibitor molecules 615 may be removed from the surface of the bulk conductive material and encapsulated by the carrier molecules 803 to form the host-guest complexes 807. The conductive material atoms 613 may be bonded to the chelator molecules 805 to form the chelator complexes 809.

Once the cleaning process is complete, the CMP cleaning solution 701 may be removed from the top surface of the substrate 101. For example, in an embodiment in which the CMP cleaning solution 701 is applied using a spin-on process, the CMP cleaning solution 701 may be removed from the top surface of the substrate 101 by discontinuing the application of the CMP cleaning solution 701 while the continuing to rotate the substrate 101.

In comparison with conventional cleaning processes, cleaning the surface of the substrate 101 with the CMP cleaning solution 701 including the carrier molecules 803 prevents metal corrosion and recessing of the first contact 401 by preventing the inhibitor molecules 615 from re-bonding or otherwise re-attaching to the surface of the first contact 401. The presence of the carrier molecules 803 in the CMP cleaning solution 701 may also help to reduce the amount of the second inhibitor included in the CMP cleaning solution. The second inhibitor used in conventional cleaning processes may comprise toxic amines. Because the carrier molecules 803 are derived from natural products and are biocompatible, the use of the carrier molecules 803 in the CMP cleaning solution 701 may reduce the amount of toxic amines used in the cleaning process according to the embodiments. Moreover, the carrier molecules 803 are derived from natural products and are biocompatible. Thus, the use of the CMP cleaning solution 701 including the carrier molecules 803 reduces the amount of toxic amines used in conventional cleaning processes.

Figure 9:
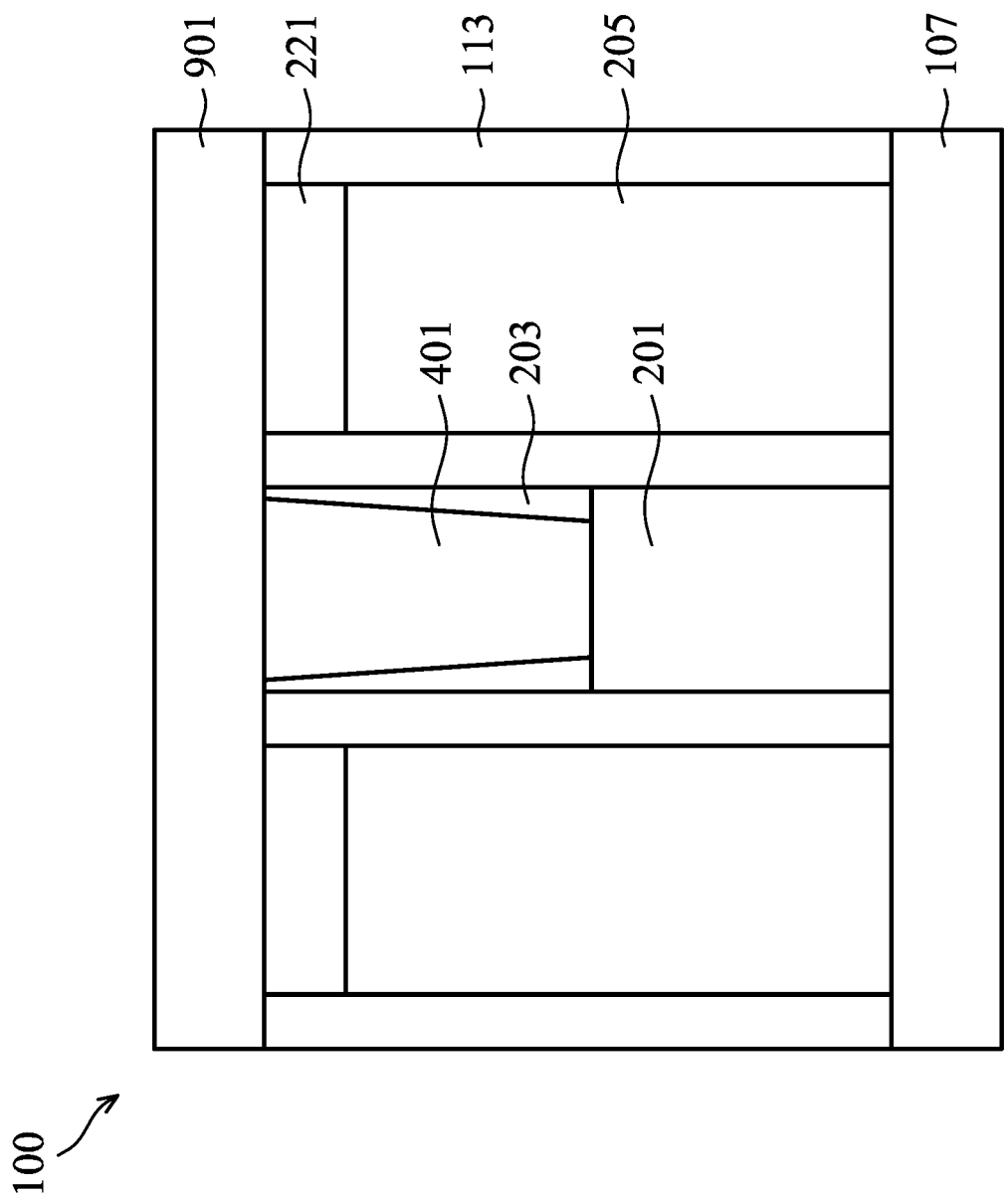
FIG. 9 illustrates an application of a rinsing liquid in accordance with some embodiments.

FIG. 9 illustrates an application of a rinsing liquid 901 on the top surface of the substrate 101. The rinsing liquid 901 may be used in a rinsing process to rinse the surface of the substrate 101. More specifically, the rinsing liquid 901 may be used to rinse any CMP cleaning solution 701, including inhibitor molecules 615 and conductive material atoms 613 dissolved therein, from the surface of the substrate 101. The rinsing liquid 901 may comprise deionized (DI) water, alcohol, combinations thereof, or the like.

The rinsing liquid 901 may be applied to the top surface of the substrate 101. More specifically, the rinsing liquid 901 may be applied on the top surfaces of the first contact 401, the first spacers 113, and the capping layer 221. The rinsing liquid 901 may be applied through a nozzle in a spin-on process; although any suitable application, such as through a brush, a sponge, a pencil brush, combinations of these, or the like may be utilized. The rinsing liquid 901 may be applied continuously throughout the rinsing process, or may be applied intermittently. The cleaning process may be performed at a temperature of between about 10° C. and about 35° C., such as about 25° C. The rinsing process may be continuous or intermittent, and may continue for about 30 seconds, about 60 seconds, less than a minute, or any other time.

Following the rinsing process, the rinsing liquid 901 may be removed from the top surface of the substrate 101. For example, in an embodiment in which the rinsing liquid 901 is applied using a spin-on process, the rinsing liquid 901 may be removed from the top surface of the substrate 101 by discontinuing the application of the rinsing liquid 901 while the continuing to rotate the substrate 101.

Figure 10:
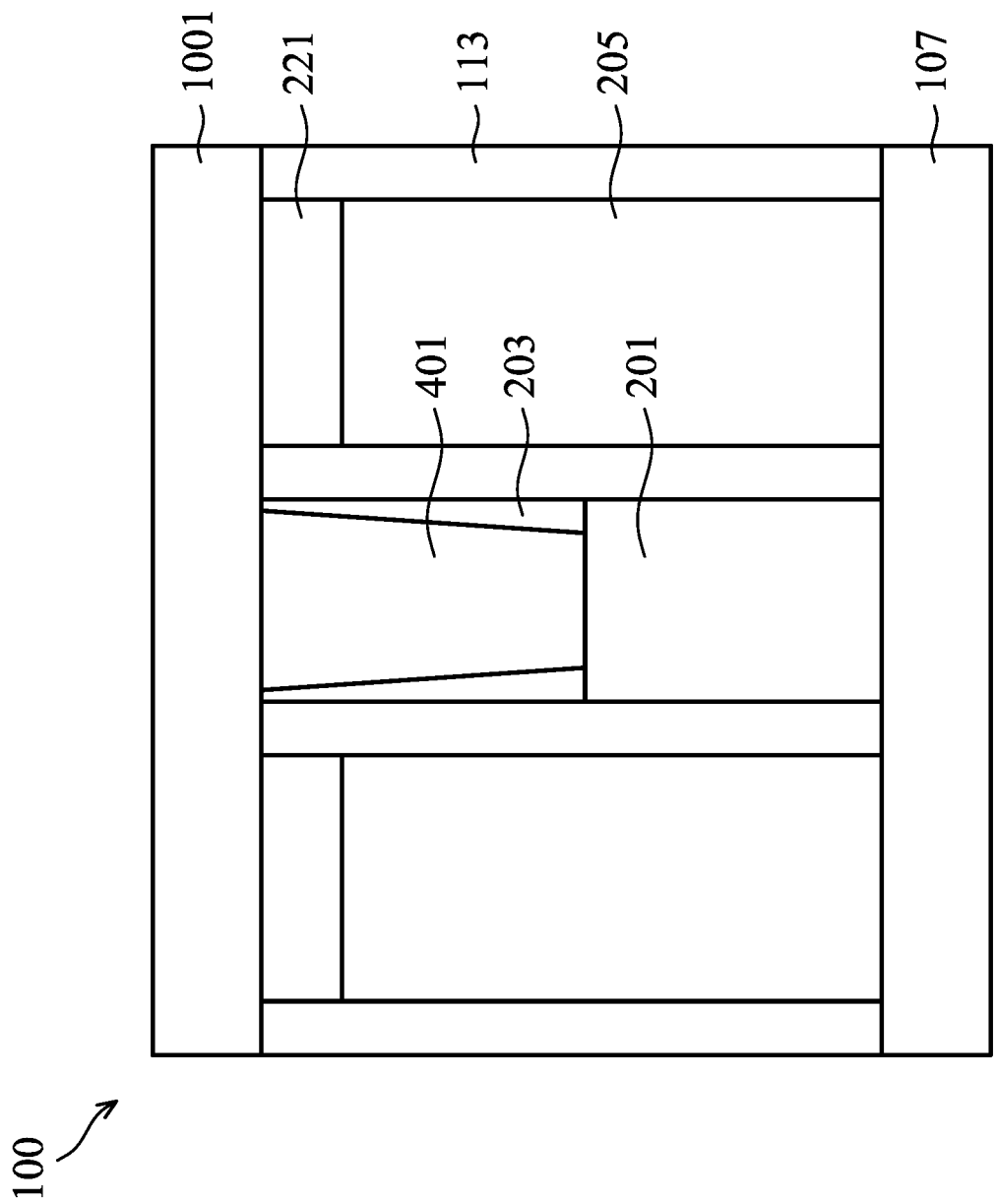
FIG. 10 illustrates an application of a drying liquid in accordance with some embodiments.

FIG. 10 illustrates an application of a drying liquid 1001 on the top surface of the substrate 101. The drying liquid 1001 may be used in a drying process to dry the surface of the substrate 101. More specifically, the drying liquid 1001 may be used to dry any rinsing liquid 901 from the surface of the substrate 101. The drying liquid 1001 may comprise an alcohol, such as isopropyl alcohol (IPA) or the like.

The drying liquid 1001 may be applied to the top surface of the substrate 101. More specifically, the drying liquid 1001 may be applied on the top surfaces of the first contact 401, the first spacers 113, and the capping layer 221. The drying liquid 1001 may be applied through a nozzle in a spin-on process; although any suitable application, such as through a brush, a sponge, a pencil brush, combinations of these, or the like may be utilized. The drying liquid 1001 may be applied continuously throughout the drying process, or may be applied intermittently. The drying process may be performed at a temperature of between about 15° C. and about 40° C., such as about 25° C. The drying process may be continuous or intermittent, and may continue for about 30 seconds, about 60 seconds, less than a minute, or any other time.

Following the drying process, the drying liquid 1001 may be removed from the top surface of the substrate 101. For example, in an embodiment in which the drying liquid 1001 is applied using a spin-on process, the drying liquid 1001 may be removed from the top surface of the substrate 101 by discontinuing the application of the drying liquid 1001 while the continuing to rotate the substrate 101. The drying liquid 1001 may evaporate or boil from the surface of the substrate 101.

Figure 11:
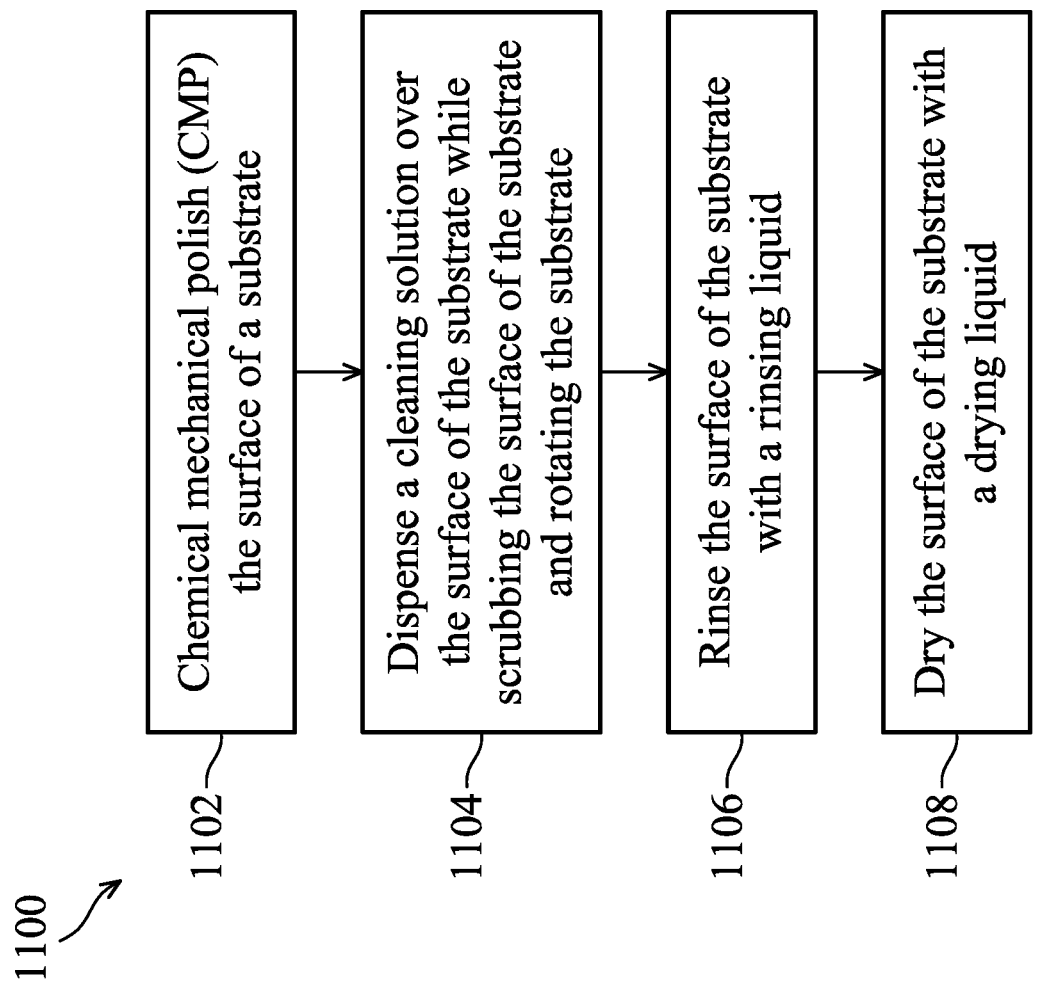
FIG. 11 illustrates a flow diagram of a method of cleaning a surface of a substrate in accordance with some embodiments.

FIG. 11 illustrates a flow diagram of a method of cleaning the surface of a substrate 101. The substrate 101 may comprise a semiconductor device 100. The semiconductor device 100 may be a FinFET, a planar FET, a horizontal gate-all-around (HGAA) FET, a vertical gate-all-around (VGAA) FET, or any other device. In step 1102, the surface of the substrate 101 undergoes a chemical mechanical polishing (CMP) process 600. The CMP process 600 removes excess conductive material formed on the top surface of the substrate 101 and planarizes the top surface of the substrate 101.

In step 1104, a CMP cleaning solution 701 is dispensed over the top surface of the substrate 101 while the top surface of the substrate 101 is scrubbed with a scrubber and the substrate 101 is rotated. The CMP cleaning solution 701 may be dispensed through a nozzle in a spin-on process; although any suitable application, such as through a brush, a sponge, a pencil brush, combinations thereof, or the like may be utilized. The scrubber may be a brush, a sponge, a pencil brush, combinations thereof, or the like. The CMP cleaning solution 701 may be dispensed through the scrubber. The processes of step 1104 may be continuous or intermittent and may continue for about 30 seconds, 60 seconds, less than a minute, or any other time.

In step 1106, the surface of the substrate 101 is rinsed with a rinsing liquid 901 to remove the CMP cleaning solution 701 from the surface of the substrate 101. In step 1108, the surface of the substrate 101 is dried with a drying liquid 1001 to remove any remaining CMP cleaning solution 701 and rinsing liquid 901 from the surface of the substrate 101.

The foregoing broadly outlines some aspects of embodiments described herein. Some embodiments described herein are described in the context of performing a chemical mechanical polishing (CMP) process on a first contact 401 in a fin field-effect transistor (FinFET). However, implementations of aspects of the present disclosure may be used in other processes, in other devices, and/or for other layers. For example, other example devices can include planar FETs, horizontal gate-all-around (HGAA) FETs, vertical gate-all-around (VGAA) FETs, and other devices. The methods and cleaning solutions described above may be used to planarize other dielectric layers, other contacts (e.g., a gate contact, a source contact, or the like), metal vias, metal lines, or any other layers in semiconductor devices. A person having ordinary skill in the art will readily understand other modifications that may be made, which are contemplated within the scope of other embodiments. Although method embodiments may be described in a particular order, various other method embodiments may be performed in any logical order and may include fewer or more steps than what is described.

In an embodiment, a method for cleaning a semiconductor device includes polishing a material from a first surface of the semiconductor device and cleaning the first surface with a cleaning solution. The cleaning solution includes a host having at least one ring. The host has a hydrophilic exterior and a hydrophobic interior. In an embodiment, cleaning the first surface further includes scrubbing the first surface with a scrubber selected from the group consisting of a brush, a sponge, and a pencil brush. In an embodiment, cleaning the first surface further includes rotating the semiconductor device. In an embodiment, the method further includes rinsing the first surface with deionized water. In an embodiment, the method further includes drying the first surface with isopropyl alcohol. In an embodiment, the host forms a host-guest complex with a CMP inhibitor disposed on the first surface of the semiconductor device. In an embodiment, the host includes cyclodextrin.

In accordance with another embodiment, a method for manufacturing a semiconductor device includes bonding an inhibitor to a conductive material atom disposed on the surface of the semiconductor device, reacting a chelator molecule with the conductive material atom to remove the inhibitor from the surface of the semiconductor device, and encapsulating the inhibitor with an encapsulant. In an embodiment, the encapsulant prevents the inhibitor from being re-deposited on the surface of the semiconductor device. In an embodiment, the conductive material atom comprises cobalt. In an embodiment, the encapsulant comprises cyclodextrin. In an embodiment, the method further includes rinsing the surface of the semiconductor device with a rinsing liquid. In an embodiment, the method further includes drying the surface of the semiconductor device with a drying liquid. In an embodiment, the rinsing liquid comprises water. In an embodiment, the drying liquid comprises isopropyl alcohol.

In accordance with yet another embodiment, a chemical mechanical polishing cleaning solution includes a chelator and a plurality of carrier molecules. The plurality of carrier molecules includes ring-shaped molecules having a hydrophilic exterior and a hydrophobic interior. In an embodiment, the plurality of carrier molecules includes cyclodextrin. In an embodiment, the plurality of carrier molecules is selected from the group consisting of α-cyclodextrin, β-cyclodextrin, and γ-cyclodextrin. In an embodiment, the plurality of carrier molecules is present in an amount of less than 1 percent by weight of the solution. In an embodiment, the chelator is present in the amount of less than 2 percent by weight of the solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a semiconductor device, the method comprising:
   polishing a material away from a first surface of a semiconductor device; and
   cleaning the first surface with a cleaning solution, the cleaning solution comprising a host having at least one ring, the host having a hydrophilic exterior, and the host having a hydrophobic interior, the cleaning solution further comprising an inhibitor, the inhibitor comprising pyridine, wherein the host comprises a combination of α-cyclodextrin, β-cyclodextrin, and γ-cyclodextrin, and wherein relative concentrations of α-cyclodextrin, β-cyclodextrin, and γ-cyclodextrin included in the cleaning solution are selected depending on the size of the inhibitor.

2. The method of claim 1, wherein cleaning the first surface further comprises scrubbing the first surface with a scrubber selected from the group consisting of a brush, a sponge, and a pencil brush.

3. The method of claim 2, wherein cleaning the first surface further comprises rotating the semiconductor device.

4. The method of claim 3, further comprising rinsing the first surface with deionized water.

5. The method of claim 4, further comprising drying the first surface with isopropyl alcohol.

6. The method of claim 5, wherein the host forms a host-guest complex with a CMP inhibitor disposed on the first surface of the semiconductor device.

7. A method for cleaning a semiconductor device, the method comprising:
   dispensing a chemical mechanical polishing (CMP) slurry onto a conductive material;
   polishing the conductive material;
   removing the CMP slurry; and
   cleaning the conductive material using a cleaning solution comprising ring-shaped molecules having a hydrophilic exterior and a hydrophobic interior, wherein the cleaning the conductive material comprises reacting a chelator molecule with the conductive material, wherein the reacting the chelator molecule with the conductive material removes a one-atom thick layer of conductive material atoms from a bulk conductive material at the surface of the conductive material, wherein the chelator molecule comprises histidine.

8. The method of claim 7, wherein the CMP slurry comprises an inhibitor.

9. The method of claim 8, wherein during the cleaning the conductive material, the ring-shaped molecules encapsulate the inhibitor in the hydrophobic interior of the ring-shaped molecules.

10. The method of claim 9, wherein the reacting the chelator molecule with the conductive material removes the inhibitor from the conductive material prior to the ring-shaped molecules encapsulating the inhibitor.

11. The method of claim 7, wherein the polishing the conductive material forms a first planar surface, wherein the method further comprises rinsing the first planar surface of the conductive material with water.

12. The method of claim 11, further comprising drying the first planar surface of the conductive material with isopropyl alcohol.

13. The method of claim 7, wherein the polishing the conductive material comprises a bulk CMP process using a first platen, a fine CMP process using a second platen, and a buffing CMP process using a third platen.

14. A method for cleaning a semiconductor device, the method comprising:
   polishing a semiconductor device to form a first planar surface using a chemical mechanical polishing (CMP) process, wherein the first planar surface comprises a conductive contact, an interlayer dielectric layer surrounding the contact, a capping layer, and gate spacers on sidewalls of the capping layer, wherein the CMP process comprises bonding an inhibitor to a conductive material atom of the conductive contact disposed at the first planar surface of the semiconductor device, wherein the inhibitor comprises a phosphoric ester; and
   cleaning the first planar surface, wherein the cleaning the first planar surface comprises:
      reacting a chelator molecule with the conductive material atom to remove the inhibitor from the first planar surface of the semiconductor device; and
      encapsulating the inhibitor with an encapsulant, wherein the encapsulant comprises a cucurbituril.

15. The method of claim 14, wherein the encapsulant comprises a ring-shaped molecule having a hydrophobic interior and a hydrophilic exterior.

16. The method of claim 15, wherein the conductive material atom comprises cobalt.

17. The method of claim 15, wherein the cleaning the first planar surface further comprises rinsing the first planar surface of the semiconductor device with a rinsing liquid.

18. The method of claim 17, wherein the cleaning the first planar surface further comprises drying the first planar surface of the semiconductor device with a drying liquid.

19. The method of claim 15, wherein the cleaning the first planar surface comprises exposing the first planar surface to a cleaning solution, the cleaning solution comprising the chelator molecule, the encapsulant, and a second inhibitor, the second inhibitor comprising aniline.

20. The method of claim 1, wherein the cleaning solution comprises from 0 to 5 weight percent α-cyclodextrin, from 0 to 5 weight percent β-cyclodextrin, and from 0 to 5 weight percent γ-cyclodextrin.

\* \* \* \* \*